United States Patent [19]

Nelson et al.

[11] 4,063,173
[45] Dec. 13, 1977

[54] DUAL MODE RECEIVER

[75] Inventors: John Raymond Nelson, Scottsdale; James Robert Shaner; Don Reginald Holcomb, both of Phoenix, all of Ariz.

[73] Assignee: Motorola, Inc., Schaumburg, Ill.

[21] Appl. No.: 672,588

[22] Filed: Apr. 1, 1976

[51] Int. Cl.$^2$ ............................................... H04B 1/59
[52] U.S. Cl. ................................... 325/11; 343/6.8 R
[58] Field of Search .................... 325/8, 9, 11, 17, 25, 325/421; 329/122, 124; 331/1 R, 2, 1 G, 25; 343/6.8 R, 6.8 LC, 7.7

[56] References Cited

U.S. PATENT DOCUMENTS

| | | | |
|---|---|---|---|
| 3,611,139 | 10/1971 | George | 325/11 |
| 3,878,527 | 5/1975 | Rensin et al. | 343/7.7 |
| 3,949,296 | 4/1976 | McClaskey et al. | 325/17 |

Primary Examiner—Benedict V. Safourek
Attorney, Agent, or Firm—Eugene A. Parsons

[57] ABSTRACT

A transponder including a receiver and a transmitter controlled by the output of the receiver, with the receiver including a first phase locked loop with a mixer and a voltage controlled oscillator supplying an output to a second phase locked loop including a switchable frequency divider connected to supply a low side injection signal to the mixer of the first loop in the first mode of operation and a high side injection signal to the mixer in the second mode of operation.

6 Claims, 1 Drawing Figure

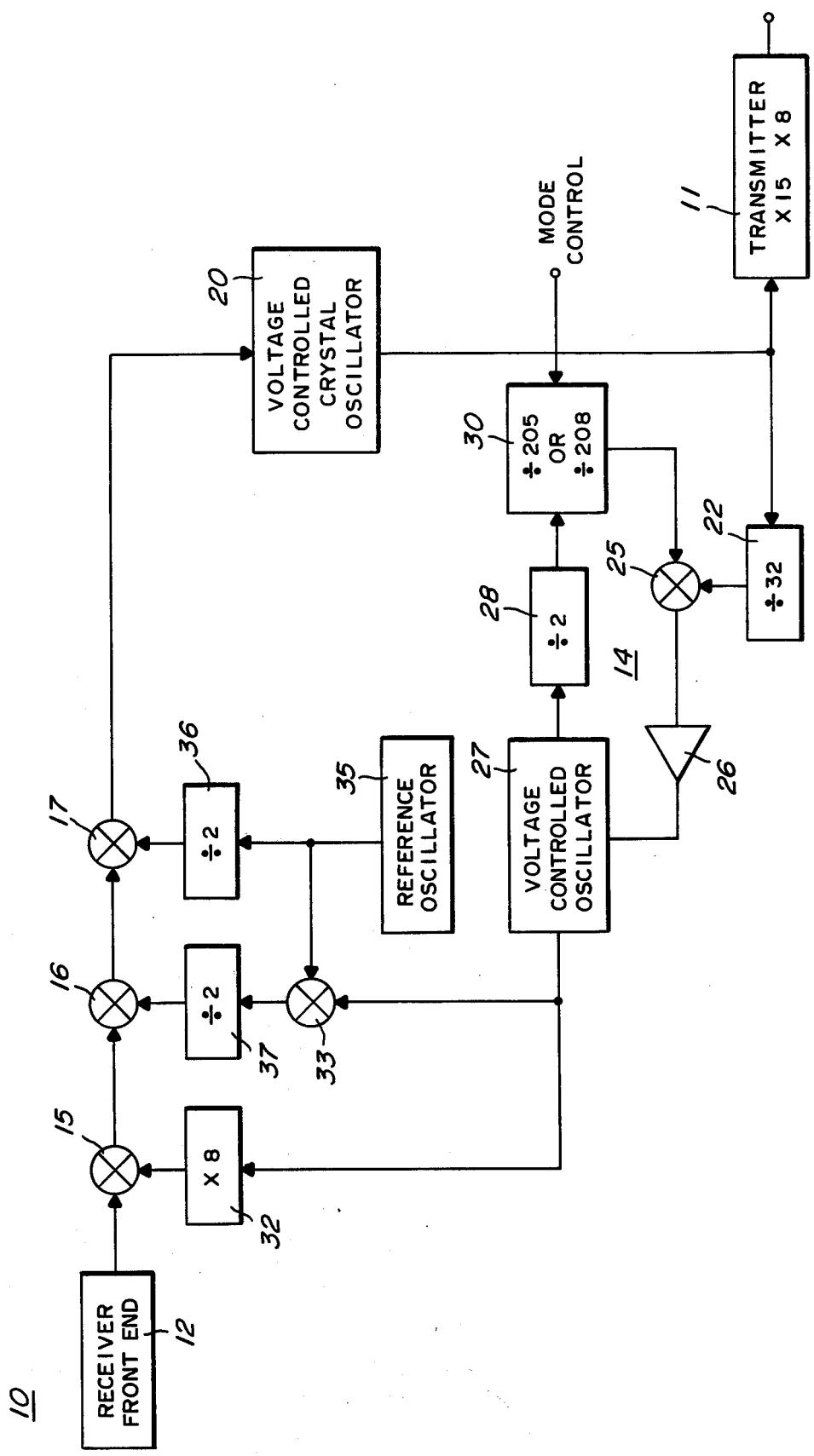

DUAL MODE RECEIVER

BACKGROUND OF THE INVENTION

While the present invention might apply to a variety of receivers, it is specifically designed as a transponder for use in satellite communications. Specifically, when the receiver receives a signal of the correct frequency, the frequency of the transmitter is controlled so that it is phase locked with the signal received by the receiver.

More specifically, in satellite communications transponders are generaly utilized which are referred to as S-band transponders. The prior art receivers of these S-band transponders operate either in the SGLS (DOD) frequency range of 1763.721 to 1839.795 mHz or in the STDN (NASA) frequency range of 2028.1 to 2115.6 mHz. It should be noted that S-band transponders transmit in the same frequency band whether in SGLS or STDN mode and, therefore, no modification to the transmitter frequency scheme is necessary or desirable in order to implement the dual mode function. To convert the prior art receivers to dual mode, so they will receive either the SGLS mode or the STDN mode, requires additional duplicate circuts, such as two voltage controlled oscillators or two LO multipliers. The present dual mode receiver provides the dual mode function with no increase in complexity of the receiver.

SUMMARY OF THE INVENTION

The present invention pertains to a dual mode receiver including a first phase locked loop with a mixer and a voltage controlled crystal oscillator supplying an output to a second phase locked loop having a switchable frequency divider therein for dividing the frequency from the voltage controlled crystal oscillator by a first divisor to supply a low side injection signal to the mixer in the first phase locked loop and by a second divisor to supply a high side injection signal to the mixer.

It is an object of the present invention to provide a new and improved dual mode receiver.

It is a further object of the present invention to provide a dual mode receiver wherein the modes of operation may be changed by simply changing a switchable frequency divider in a phase locked loop, and the injection signal supplied to a mixer in a second loop is switched from the low side to the high side.

These and other objects of this invention will become apparent to those skilled in the art upon consideration of the accompanying specification, claims and drawing.

BRIEF DESCRIPTION OF THE DRAWING

The single FIGURE is a block diagram of a transponder incorporating the present invention.

DESCRIPTION OF THE PREFERRED EMBODIMENT

Referring to the figure, a transponder is illustrated which includes a receiver generally designated 10 and a transmitter designated 11. The receiver 10 includes a receiver front end 12, a first phase locked loop generally designated 13 and a second phase locked loop generally designated 14. Output signals from the receiver front end 12 are supplied to a first input of a mixer 15, the output of which is supplied to a first input of a mixer 16. The output of the mixer 16 is connected to a first input of a phase detector 17, the output of which is applied to a voltage controlled crystal oscillator 20. The output of the voltage controlled crystal oscillator 20 is applied through a divider 22 to a phase detector 25 in the second phase locked loop 14. The output of the phase detector 25 is applied through a filter/amplifier 26 to an input of a voltage controlled oscillator 27. One output of the voltage controlled oscillator 27 is applied through a first divider 28 to a switchblade frequency divider 30, the frequency of which is controlled by a mode control signal from a device (not shown), such as a switch or the like. Output signals from the switchable frequency divider 30 are supplied to a second input of the phase detector 25 to complete the second phase locked loop. Output signals from the second phase locked loop are supplied at a second output of the voltage controlled oscillator 27 and applied through a divider (multiplier) 32 to a second input of the mixture 15 and to a first input of a mixer 33. A second input of the mixer 33 is received from a reference oscillator 35 which also supplies a signal through a divider 36 to a second input of the phase detector 17. The output of the mixer 33 is applied through a divider 37 to a second input of the mixer 16. The output of the voltage controlled crystal oscillator 20 is also applied to an input of the transmitter 11 to control the transmitter. For example, the phase of the output signal of the transmitter may be controlled by the receiver voltage controlled crystal oscillator 20 so it is coherent with the signal received by the receiver front end 12.

To facilitate explaining the operation of the present circuitry an S-band transponder will be described and a specific frequency in the SGLS mode and in the STDN mode will be utilized with the values of the various dividers and mulitpliers being set in accordance with these frequencies. It should be understood, however, that substantially any desired frequencies might be utilized, and the term "divider" is used generically to include any device which will raise or lower a frequency the desired amount. The frequency range of the SGLS mode extends from 1763.721 to 1839.795 mHz and in the present embodiment the frequency of 1775.733 mHz will be used. The frequency range of the STDN mode extends from 2028.1 to 2115.6 mHz and in the present embodiment the frequency of 2041.9479 mHz will be used. When the switchable frequency divider 30 is in the SGLS mode, i.e. divide by 205, the second phase locked loop 14 adjusts the frequency of the voltage controlled oscillator 27 until it supplies a signal at a frequency of 236.7648 mHz. The divider 28 divides the frequency of this signal by 2 so that the signal applied to the switchable frequency divider 30 is at a frequency of 118.3824 mHz. Dividing this frequency by 205 produces a signal at a frequency of 0.577474 mHz which approximately corresponds with the frequency of the signal applied by the voltage controlled crystal oscillator 20, which is 18.4792 mHz divided by 32 in the divider 22. Thus, in the SGLS mode the output from the voltage controlled oscillator 27 to the multiplier 32 and mixer 33 is a signal with a frequency of 236.7648 mHz.

In the STDN mode the switchable frequency divider 30 is switched to divide by 208 and the voltage controlled oscillator 27 is controlled by the second phase locked loop 14 to supply a signal having a frequency of 240.2292 mHz, which is divided by 2 in the divider 28 and supplied as a signal having a frequency of 120.1146 mHz to the switchable frequency divider 30. The divider 30 divides the frequency of the signal input by 208 so that the output signal has a frequency of 0.577474 mHz, as in the previous mode. Thus, in the STDN mode the voltage controlled oscillator 27 supplies a signal having a freqeuncy of 240.2292 mHz to the multiplier 32 and the mixer 33.

With the frequencies prescribed, the divider (multiplier) 32 is constructed to multiply by 8, the divider 37 divides by 2, the divider 36 divides by 2 and the reference oscillator 35 produces a signal having a frequency of 24.5 mHz. Thus, when the receiver front end 12 receives a signal with a frequency of 2041.9479 mHz and the switchable frequency divider 30 is in the STDN mode of operation, the frequency applied to the mixer 15 from the divider 32 is 1921.8333 mHz which is a low side injection signal and the output signal from the mixer 15 has a frequency of 120.1146 mHz. When the switchable frequency divider 30 is in the SGLS mode of operation and the receiver front end 12 receives a signal having a frequency of 1775.733 mHz the divider 32 supplies a signal having a frequency of 1894.118 mHz to the mixer 15, which is a high side injection signal and the output of the mixer 15 has a frequency of 118.385 mHz. In the STDN mode of operation the mixer 33 supplies an output signal at a frequency of 215.7292 mHz and in the SGLS mode of operationit supplies a signal at a frequency of 212.2648 mHz. Thus, in both modes of operation the output frequency of the mixer 15 is 12.25 mHz and, as previously stated, the complexity of the receiver 10 is not increased since the only change between the STDN mode and the SGLS mode of operation is the change of divisors in the switchable frequency divider 30. Because the mixer 15 receives a low side injection signal in one mode and a high side injection signal in the other mode, the bandwidth of the various components can be relatively standard and the warp range of the oscillators is generally within prescribed standards for off the shelf components.

Thus, as can be seen from the above described specific example, a dual mode receiver is disclosed which does not require additional components or increased complexity. The described receiver can easily operate in dual modes by simply switching the divisor in the second phase locked loop. While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim

1. In a transponder including a receiver and a transmitter, apparatus providing dual mode operation of the receiver comprising
   a. a first phase locked loop including a first mixer connected to the receiver for receiving therefrom a signal of a first frequency in a first mode of operation and a signal of a second frequency, different from said first frequency, in a second mode of operation, said first phase locked loop supplying an output signal to control the transmitter;
   b. a second phase locked loop connected to receive the output signal from said first phase locked loop and further connected to supply a low-side injection signal to said first mixer in the first mode of operation and a high-side injection signal to said first mixer in the second mode of operation, said second phase locked loop including switchable frequency divider means for switching said second phase locked loop between the first and the second modes of operation.

2. Apparatus as claimed in claim 1 wherein the first phase locked loop includes
   a. the first mixer having first and second inputs and an output;
   b. a second mixer having first and second inputs and an output;
   c. a third mixer having first and second inputs and an output;
   d. a phase detector having first and second inputs and an output;
   e. a reference oscillator;
   f. a voltage controlled crystal oscillator having an input and an output;
   g. the output of said first mixer being connected to the first input of said second mixer, the output of said second mixer being connected to the first input of said phase detector, the output of said phase detector being connected to the input of said crystal oscillator and the output of said crystal oscillator being connected to the second phase locked loop;
   h. first divider means connecting the second phase locked loop to the second input of said first mixer;
   i. second divider means connecting the output of the third mixer to the second input of the second mixer;
   j. third divider means connecting said reference oscillator to the second input of said phase detector; and
   k. the output of the crystal oscillator being coupled to the transmitter, the second phase locked loop being coupled to the first input of the third mixer and the reference oscillator being connected to the second input of the third mixer.

3. Apparatus as claimed in claim 2 wherein the first divider means includes a circuit for increasing the frequency by a factor of eight, the second divider means includes a circuit for reducing the frequency by a factor of two, and the third divider means includes a circuit for reducing the frequency by a factor of two.

4. Apparatus as claimed in claim 1 wherein the second phase locked loop includes
   a. a phase detector having first and second inputs and an output;
   b. a voltage controlled oscillator having an input and an output;
   c. the switchable frequency divider means being connected to the output of said voltage controlled oscillator and supplying a signal to the first input of said phase detector;
   d. divider means connecting the first phase locked loop to the second input of said phase detector; and
   e. means connecting the output of said phase detector to the input of said voltage controlled oscillator.

5. Apparatus as claimed in claim 4 wherein the divider means includes a circuit for decreasing the frequency of the signal from the first phase locked loop by a factor of thirty two.

6. Apparatus as claimed in claim 4 wherein the switchable frequency divider means includes a first circuit for reducing the frequency of the output of the voltage controlled oscillator by a factor of two and further includes a second circuit for reducing the frequency of the signal from said first circuit by a factor of 208 in the first mode of operation and by a factor of 205 in the second mode of operation.

* * * * *